(12) United States Patent
Avoyan et al.

(10) Patent No.: US 9,406,534 B2
(45) Date of Patent: Aug. 2, 2016

(54) WET CLEAN PROCESS FOR CLEANING PLASMA PROCESSING CHAMBER COMPONENTS

(71) Applicant: Lam Research Corporation, Fremont, CA (US)

(72) Inventors: Armen Avoyan, Oakland, CA (US); Kennet Baylon, Santa Clara, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/525,118

(22) Filed: Oct. 27, 2014

(65) Prior Publication Data

US 2016/0079096 A1 Mar. 17, 2016

Related U.S. Application Data (60) Provisional application No. 62/051,920, filed on Sep. 17, 2014.

(51) Int. Cl.
| | |
|---|---|
| *H01L 21/302* | (2006.01) |
| *H01L 21/67* | (2006.01) |
| *H01L 21/02* | (2006.01) |
| *B08B 3/08* | (2006.01) |

(52) U.S. Cl.
CPC ............ *H01L 21/67017* (2013.01); *B08B 3/08* (2013.01); *H01L 21/02052* (2013.01); *H01L 21/02054* (2013.01)

(58) Field of Classification Search
CPC ................. H01L 21/02063; H01L 21/02052; H01L 21/02076; H01L 21/6704; H01L 21/67023; H01L 21/67028; C23C 16/4405; C23C 16/4407; B08B 3/12
USPC ............. 438/745, 750, 754; 134/1.1, 1.2, 1.3, 134/1.4, 2, 22.1, 9
See application file for complete search history.

(56) References Cited

U.S. PATENT DOCUMENTS

| | | | | |
|---|---|---|---|---|
| 6,150,762 | A * | 11/2000 | Kim | H01J 9/14 315/111.21 |
| 6,902,627 | B2 * | 6/2005 | Brueckner | B24C 1/06 134/2 |
| 8,075,701 | B2 * | 12/2011 | Avoyan | H01J 37/32862 134/2 |
| 9,057,134 | B2 * | 6/2015 | Andreoli | C23F 1/36 |
| 2009/0142247 | A1 * | 6/2009 | Sun | C04B 41/009 423/345 |
| 2009/0325320 | A1 * | 12/2009 | Avoyan | H01J 37/32862 438/4 |

* cited by examiner

*Primary Examiner* — Lan Vinh
(74) *Attorney, Agent, or Firm* — Martine Penilla Group, LLP (57) ABSTRACT

A system and method of cleaning a plasma processing chamber component includes removing the component from the plasma processing chamber, the removed component including a material deposited on the surface of the component. A heated oxidizing solution is applied to the material deposited on the component to oxidize a first portion deposited material. A stripping solution is applied to the component to remove the oxidized first portion of the deposited material. An etching solution is applied to remove a second portion of the deposited material and the cleaned component can be rinsed and dried.

16 Claims, 8 Drawing Sheets

WET CLEAN PROCESS FOR CLEANING PLASMA PROCESSING CHAMBER COMPONENTS

CROSS REFERENCE TO RELATED APPLICATIONS

This application claims priority from U.S. Provisional Patent Application No. 62/051,920 filed on Sep. 17, 2014 and entitled "Wet Clean Process for Cleaning Plasma Processing Chamber Components," which is incorporated herein by reference in its entirety for all purposes.

BACKGROUND

The present invention relates generally to cleaning processes, and more particularly, to methods and systems for cleaning metallic and other contaminants from ceramic, glass, quartz and silicon components of a semiconductor processing chamber.

Semiconductor process chambers are complex assemblies of very precisely shaped components of many different types of materials. Typically the semiconductor process chambers are formed of aluminum or stainless steel. The components within the semiconductor process chamber can include ceramics, stainless steel, aluminum, glass, quartz and various silicon compounds (SiO, $SiO_2$, SiC, etc.) and other materials. Many of these components are expensive, complex components with many precise surfaces and precise shapes.

Many types of processes are applied to semiconductor wafers in the semiconductor process chamber. Chemical residues and residues of materials removed from the semiconductor wafers are deposited on the various components inside the semiconductor process chamber. Periodically, the chemical residues and residues of materials removed from the semiconductor wafers must be cleaned and removed from the interior surfaces and components of semiconductor process chamber.

Removing these residues from the used process chamber components can be challenging and often more expensive and more difficult than replacing the used process chamber component with a corresponding new process chamber component. The used process chamber component can then be disposed of. What is needed is a more effective and efficient process for cleaning the used process chamber components sufficiently to allow reuse of the cleaned, used, process chamber components.

SUMMARY

Broadly speaking, the present invention fills these needs by providing systems and methods for cleaning used, process chamber components. It should be appreciated that the present invention can be implemented in numerous ways, including as a process, an apparatus, a system, computer readable media, or a device. Several inventive embodiments of the present invention are described below.

One embodiment provides a method for cleaning a plasma processing chamber component. The component to be cleaned is removed from the plasma processing chamber. The removed component having material deposited thereon. A basic cleaning process is applied to the removed component. A degreasing process if applied to the removed component and the deposited material is removed from removed component to produce a cleaned component and the cleaned component can be dried and prepared for reuse in a plasma processing chamber.

Removing the at least one material deposited on the removed component can include applying a heated oxidizing solution to the deposited material to oxidize a first portion of the deposited material. A stripping solution is applied to remove the oxidized first portion of the deposited material. An etching solution is applied to remove a second portion of the deposited material from the removed component.

The oxidizing solution can include potassium hydroxide (KOH) and/or potassium permanganate ($KMnO_4$). One oxidizing solution mixture can includes a mixture of potassium hydroxide (KOH) and potassium permanganate ($KMnO_4$) in a ratio of between about 5 parts potassium hydroxide (KOH) to about 2 parts potassium permanganate ($KMnO_4$).

The stripping solution can include hydrofluoric acid (HF) and/or nitric acid ($HNO_3$). One stripping solution mixture can includes hydrofluoric acid (HF) and nitric acid ($HNO_3$) in a ratio of about 1 part hydrofluoric acid (HF) and about 1 part nitric acid ($HNO_3$).

The etching solution can include hydrofluoric acid (HF) and/or nitric acid ($HNO_3$), and/or acetic acid (HAc). One etching solution mixture includes hydrofluoric acid (HF), nitric acid ($HNO_3$) and acetic acid (HAc) in a ratio of about 1 part hydrofluoric acid (HF), about 7.5 parts nitric acid ($HNO_3$) and about 3.7 parts acetic acid (HAc). The oxidizing solution, the stripping solution and/or the etching solution can be diluted with water.

The cleaned component can be installed in a plasma processing chamber, a substrate disposed in the plasma processing chamber and a plasma process can be applied to the substrate.

Another embodiment provides a plasma processing chamber component including an etched surface, the etched surface being etched to remove at least one material deposited on the plasma processing chamber component. The etched surface includes applying a heated oxidizing solution to a deposited material on the plasma processing chamber component to oxidize a first portion of the deposited material. The oxidizing solution includes a mixture of potassium hydroxide (KOH) and potassium permanganate ($KMnO_4$). A stripping solution is applied to the plasma processing chamber component to remove the oxidized first portion of the deposited material from the plasma processing chamber component. The stripping solution includes a mixture of hydrofluoric acid (HF) and nitric acid ($HNO_3$). An etching solution is applied to remove a second portion of the deposited material from the plasma processing chamber component. The etching solution includes a mixture of hydrofluoric acid (HF), nitric acid ($HNO_3$) and acetic acid (HAc). The cleaned component can be dried before reuse.

Advantages of this invention include the ability to clean and reuse components that were previously unable to be cleaned and reused. Another advantages provided by reusing components includes reducing operating costs by requiring fewer replacement components. Yet another advantage includes reducing waste streams of used components.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings.

DETAILED DESCRIPTION

Several exemplary embodiments for cleaning used, process chamber components will now be described. It will be apparent to those skilled in the art that the present invention may be practiced without some or all of the specific details set forth herein.

Semiconductor manufacturing processes produce various byproducts. By way of example, an etch process conducted in an etch processing chamber may produce volatile silicon and metallic compounds removed from a semiconductor wafer being processed. At least a portion of the volatile silicon and metallic compounds deposit and condense to a solid form on various surfaces within the etch processing chamber. The silicon and metallic compound deposits can generate undesirable particles if the deposits are not periodically removed from the etch processing chamber in a suitable chamber cleaning process.

A chamber cleaning process is applied to the etch processing chamber to remove at least a portion of the silicon and metallic compound deposits. However, a comprehensive chamber cleaning can often require disassembly of the etch processing chamber and removal of various components. Each of the components can then be individually cleaned and inspected before reassembly of the etch processing chamber.

Figure 1:
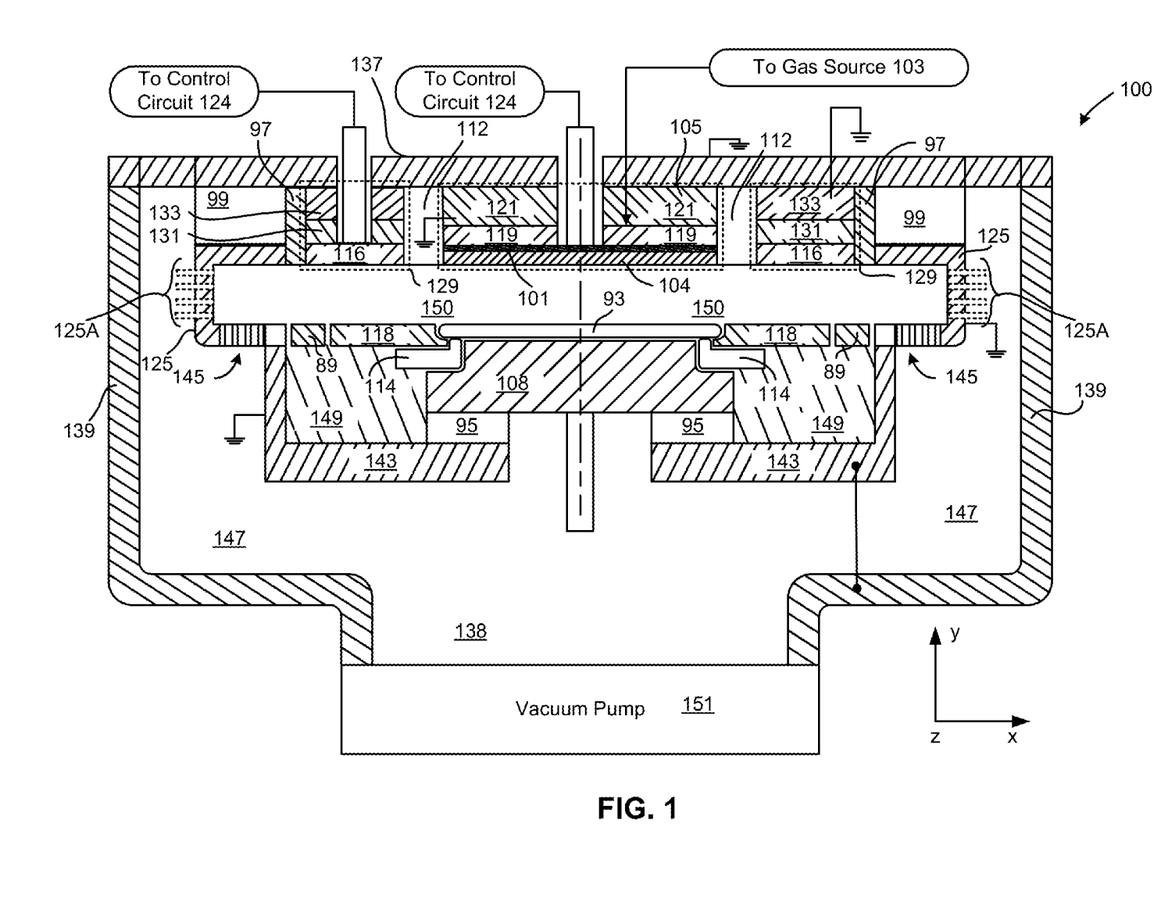
FIG. 1 is a simplified schematic diagram of a semiconductor processing chamber, for implementing embodiments of the present disclosure.

FIG. 1 is a simplified schematic diagram of a semiconductor processing chamber 100, for implementing embodiments of the present disclosure. The semiconductor processing chamber 100 is enclosed by chamber sidewalls 139, chamber top 137 and an outlet 138. The outlet 138 can be coupled to a vacuum pump 151 for drawing volatile plasma byproducts out of the processing chamber 100.

The semiconductor processing chamber 100 also includes a lower electrode 108 which often includes an electrostatic chuck for securely holding a semiconductor substrate 93 for processing in the semiconductor processing chamber. The lower electrode 108 is supported by an insulating ring 95 between the lower electrode and the support housing 143. The lower electrode 108 can be substantially surrounded by one or more RF coupling rings 114, one or more edge rings 118 and one or more insulating rings 89. The RF coupling rings 114, the edge rings 118 and the insulating rings 89 are supported by an insulator 149.

The semiconductor processing chamber 100 also includes an upper electrode assembly 105 including an upper electrode 104, a gas distribution plate 101, supporting layers 119, 121. A control circuit 124 is coupled to the upper electrode assembly for applying one or more selected RF signals to the upper electrode 104 and/or the lower electrode 108. One or more gas sources 103 are fluidly coupled to the gas distribution plate 101. The upper electrode 104 can be a showerhead type upper electrode including one or more gas ports (not shown) to allow gas distributed by the gas distribution plate 101 to flow into the semiconductor processing chamber 100. One or more insulating rings 112 surround a portion, such as a periphery, of the top electrode assembly 105 to insulate the top electrode assembly 105 from an upper electrode extension assembly 129. The upper electrode extension assembly 129 surrounds a portion, such as a periphery, of the one or more insulating rings 112.

The upper electrode extension assembly 129 includes an upper electrode extension 116, a first layer 131 and a second layer 133. In some embodiments, the upper electrode extension assembly 129 includes any number of layers. In one embodiment, the upper electrode extension 116 is made of a semiconductor. In some embodiments, the first layer 131 is made of a dielectric, such as quartz or aluminum nitride. In one embodiment, the second layer 133 is a heater that is coupled with an AC power source (not shown) or a DC power source (not shown) and ground to control heat. The heat generated from the second layer 133 is provided to the upper electrode extension 116. In several embodiments, the upper electrode extension assembly 129 excludes the second layer 133. In one embodiment, a metal layer 99 surrounds a portion of the one or more insulating rings 97.

In various embodiments, the semiconductor processing chamber 100 can also include a shroud 125. Although an annular shape of the shroud 125 is shown, in some embodiments, the shroud 125 is of a different shape, such as a shape having a polygonal cross-section or a shape having an oval cross-section. The shroud 125 can form an edge of the plasma region 150 to confine plasma within the plasma region. The shroud 125 can include slots 145. The shroud 125 can also be formed from one or more, concentric confinement rings 125A that are spaced apart, instead of the peripheral portion of the shroud.

The slots allow plasma byproducts and gases to pass from the plasma region 150 toward the outlet 138. Additional details of the semiconductor processing chamber 100 are described in co-owned and co-pending U.S. patent application Ser. No. 13/310,673, filed Dec. 2, 2012 and entitled "Systems and Methods for Controlling a Plasma Edge Region," which is incorporated by reference herein for all purposes.

Examples of components that may be removed from the semiconductor processing chamber 100 for wet cleaning can include but are not limited to the upper electrode 104, the shroud 125, the one or more confinement rings 125A, the gas distribution plate 101, the upper electrode extension 116, the edge ring(s) 118 and the insulating rings 89. The upper electrode 104, the shroud 125, the one or more confinement rings 125A, the gas distribution plate 101, the upper electrode extension 116, the edge ring(s) 118 can be formed from non-conductive materials such as a silicon containing material, such as silicon dioxide, a ceramic material, such as aluminum oxide or other ceramic materials, or a quartz containing material.

Figure 2:
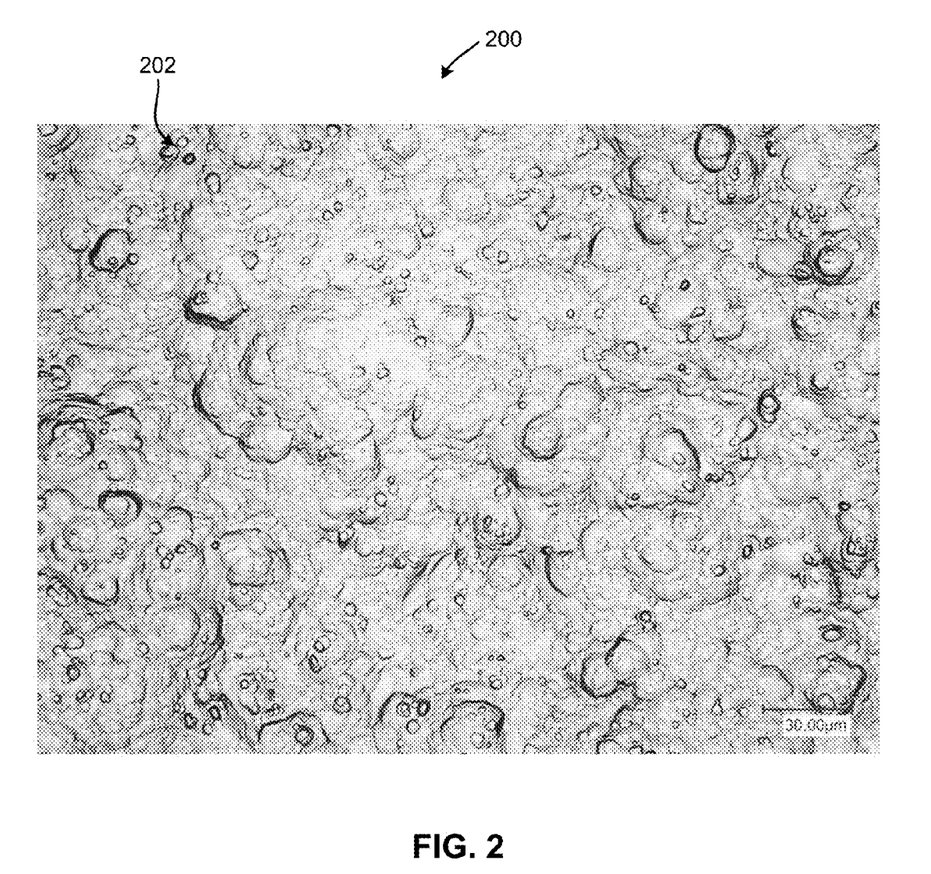
FIG. 2 is magnified view of the silicon and metallic compound deposits deposited on a surface of a component removed from the semiconductor processing chamber, for implementing embodiments of the present disclosure.

FIG. 2 is magnified view 200 of the silicon and metallic compound deposits 202 deposited on a surface of a component removed from the semiconductor processing chamber 100, for implementing embodiments of the present disclosure. A scale 30 micrometer scale is provided for reference purposes only. The silicon and metallic compound deposits 202 can be larger or smaller than shown.

Table 1 includes a non-comprehensive list of some residues often found on the components of the processing chamber in the form of trace metal contaminants in 10E15 atoms per square centimeter.

TABLE 1

| Example residues: | Typical count before cleaning: | Acceptable count after cleaning: |
|---|---|---|
| Aluminum (Al) | 8100 | 400 |
| Calcium (Ca) | 950 | 2600 |
| Chromium (Cr) | 2.5 | 2.6 |
| Cobalt (Co) | 0.8 | 0.7 |
| Copper (Cu) | 12 | 90 |
| Iron (Fe) | 600 | 2 |
| Lithium (Li) | 19 | * |
| Magnesium (Mg) | 810 | 12 |
| Manganese (Mn) | 30 | * |
| Molybdenum (Mo) | 5.5 | * |
| Nickel (Ni) | 200 | * |
| Potassium (K) | 4700 | 4 |
| Sodium (Na) | 13000 | 51 |
| Titanium (Ti) | 75 | * |
| Vanadium (V) | 6.9 | * |
| Zinc (Zn) | 1300 | 19 |

Note, that components to be cleaned that have copper containing residues may be segregated from other components not having copper containing residues to avoid potential cross contamination with the copper containing residues.

Figure 3A:
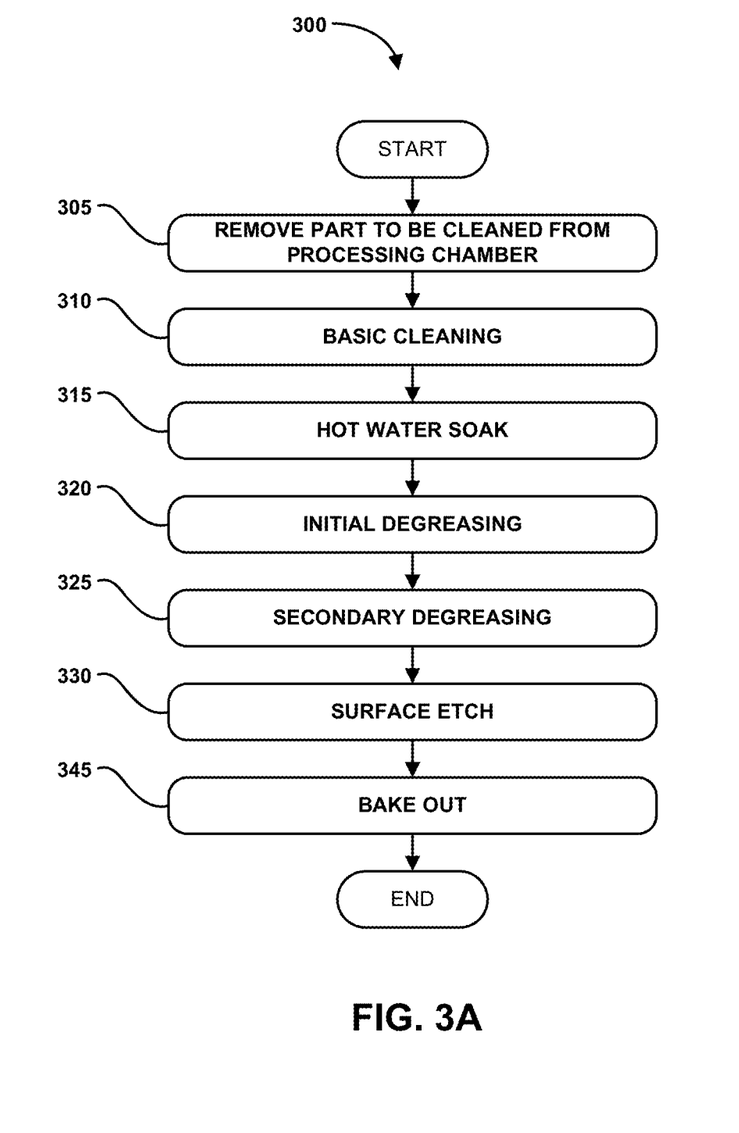
FIG. 3A is a flowchart diagram that illustrates the method operations performed in cleaning used, process chamber components, for implementing embodiments of the present disclosure.

FIG. 3A is a flowchart diagram that illustrates the method operations 300 performed in cleaning used, process chamber components, for implementing embodiments of the present disclosure. The operations illustrated herein are by way of example, as it should be understood that some operations may have sub-operations and in other instances, certain operations described herein may not be included in the illustrated operations. With this in mind, the method and operations 300 will now be described.

Figure 3B:
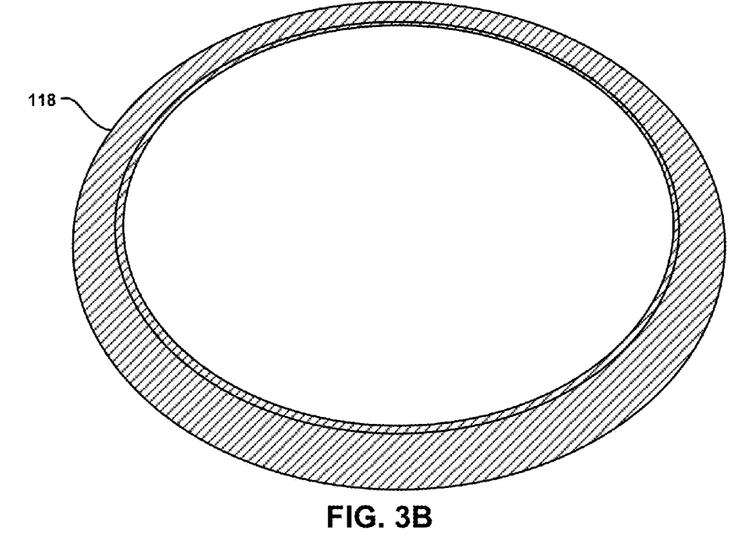
FIG. 3B illustrates an edge ring removed from the semiconductor process chamber, for implementing embodiments of the present disclosure.

In an operation 305, the component(s) to be cleaned are removed from the semiconductor process chamber 100. FIG. 3B illustrates an edge ring 118 removed from the semiconductor process chamber 100, for implementing embodiments of the present disclosure. The edge ring 118 is an example component, it should be understood that any applicable process chamber component can be removed for the wet clean processes described herein.

In an operation 310, a basic cleaning process is applied to the component to be cleaned. The basic cleaning process removes relatively loosely attached materials from the surface of the component to be cleaned. The basic cleaning process can include one or more cleaning processes such as wiping, brushing, scraping and media blasting the surface of the component to be cleaned. In one implementation the basic cleaning process can include media blasting using CO2 pellets or similar media at a pressure of between about 30 and about 40 psi and a pellet feed rate of less than about 0.3 kg/minute for a time interval of about 5 minutes or however long required to substantially remove the visible deposition. The component may need to warm up to ambient temperature before proceeding to the following operations.

Figure 3C:
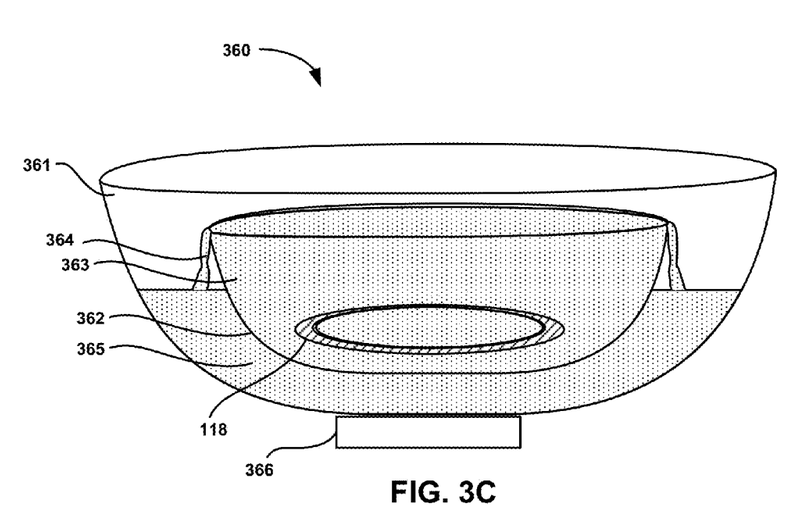
FIG. 3C shows the component to be cleaned placed in a hot water bath, for implementing embodiments of the present disclosure.

In an operation 315, the component to be cleaned is placed in a hot water bath to soak for a period of time. FIG. 3C shows the component 118 to be cleaned placed in a hot water bath 360, for implementing embodiments of the present disclosure. The component to be cleaned 118 is fully immersed in a quantity of water 363 in the hot water bath 360.

Figure 3D:
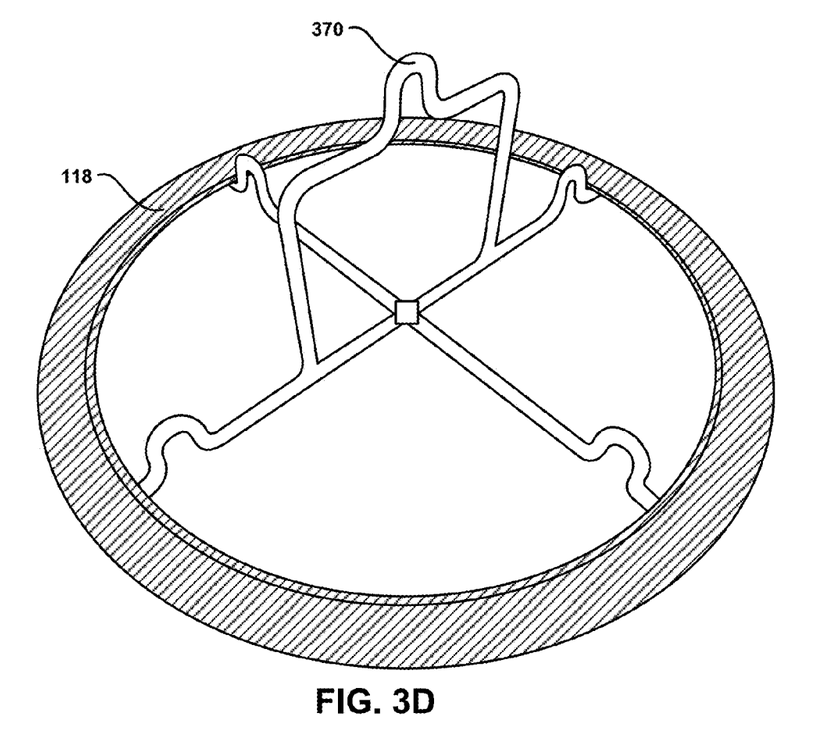
FIG. 3D shows the component supported in an optional component support, for implementing embodiments of the present disclosure.
Figure 3E:
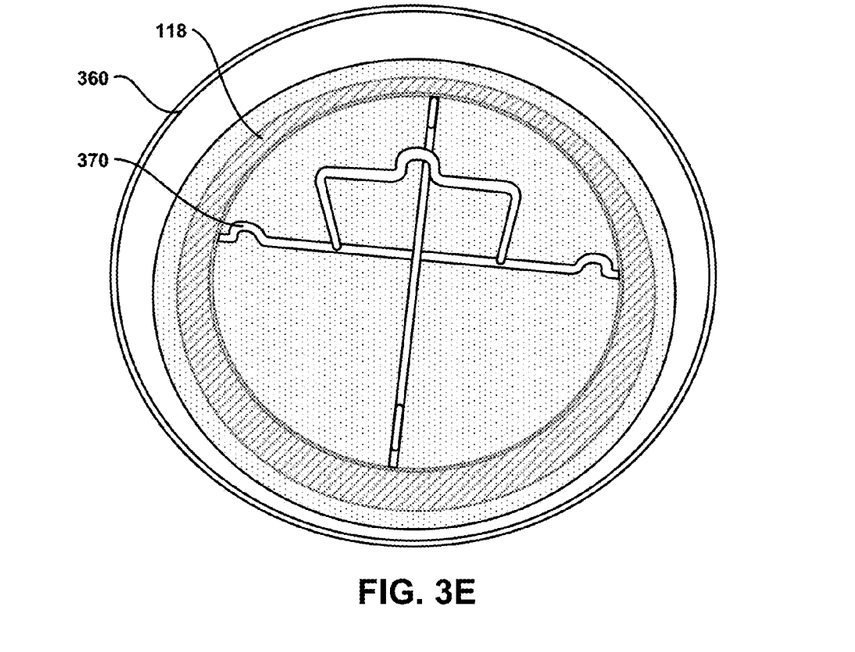
FIG. 3E shows the component supported in the optional component support in the hot water bath, for implementing embodiments of the present disclosure.

FIG. 3D shows the component 118 supported in an optional component support 370, for implementing embodiments of the present disclosure. FIG. 3E shows the component 118 supported in the optional component support 370 in the hot water bath 360, for implementing embodiments of the present disclosure. The component 118 can be supported during the hot water bath 360 by an optional component support 370. The component support 370 supports the component and provides a handle for moving the component 118, without physically handling the component. It should be understood that the optional component support 370 should be cleaned before use. By way of example, cleaning the optional component support 370 can include wiping the optional component support down using an isopropyl alcohol (IPA) wipe followed by an ultrapure water or deionized water rinse. Next, the optional component support can be wiped down using a 2% HNO3 solution wipe followed by a second ultrapure water or deionized water rinse.

The water 363 in the hot water bath 360 can be between about 65 degrees C. and about 90 degrees C. A heater 366 can be provided to heat and maintain the water at the desired temperature. The water 363 can be ultrapure water such as deionized water. The component 118 can be placed in the hot water bath 360 for between about 30 minutes and about 90 minutes.

Figure 3F:
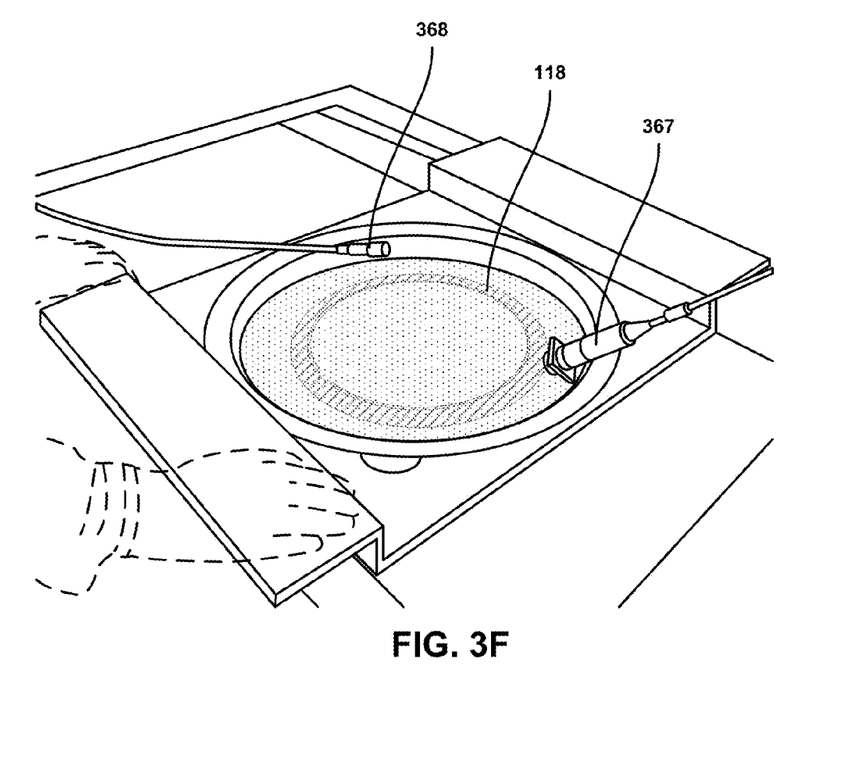
FIG. 3F shows the component in a hot water bath with an optional agitation mechanism, for implementing embodiments of the present disclosure.

The water can be agitated during the hot water bath by any suitable agitation mechanism 367. FIG. 3F shows the component 118 in a hot water bath with an optional agitation mechanism 367, for implementing embodiments of the present disclosure. By way of example, the agitation mechanism can provide stiffing or bubbling clean dry air or other gases through a nozzle 368 and into the water or ultrasonic agitation using an ultrasonic transducer such as applying an ultrasonic signal to the water 363 in the hot water bath 360. Other suitable agitation systems could also be used.

Figure 3G:
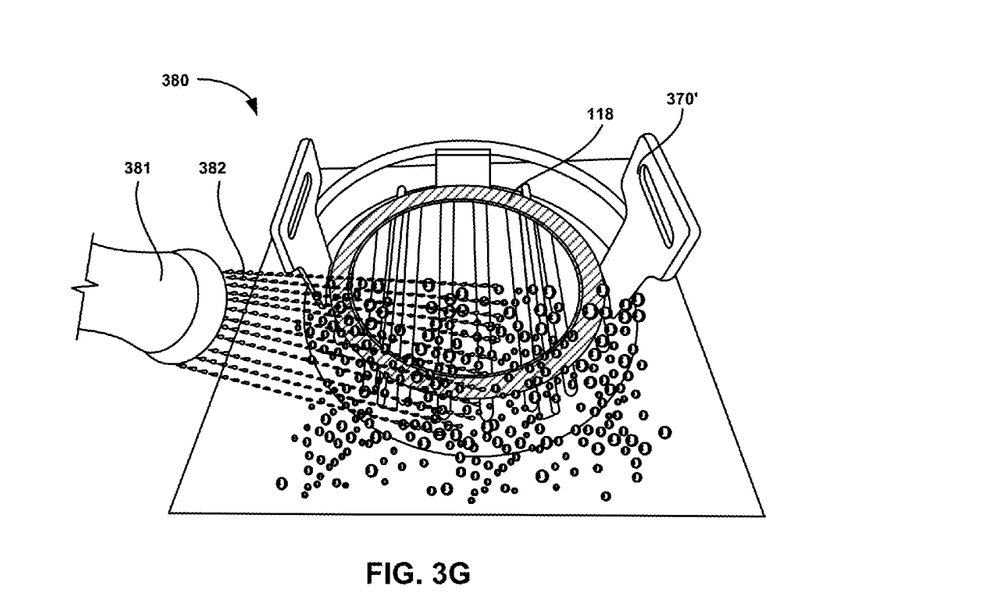
FIG. 3G shows the component supported in rinsing system, for implementing embodiments of the present disclosure.

The hot water bath 360 of operation 315 can also include a rinsing process to rinse the component 118 after the hot water bath. FIG. 3G shows the component 118 supported in rinsing system 370, for implementing embodiments of the present disclosure. The component 118 is shown being supported by an alternative, optional component support 370'. The rinsing process can include using a nozzle 381 and spray rinsing using deionized water (DIW) 382 for about 1 minute. The hot water bath of operation 315 can also include a drying operation including using a clean dry air, or other suitable gas, to blow the excess moisture off the surfaces of the component. The clean dry air, or other suitable gas, can be applied at between about 50 to about 50 psi for about a minute or longer to remove the visible moisture from the surfaces of the component.

In an operation 320, an initial degreasing process is applied to the component 118. The initial degreasing process can use a suitable solvent such as acetone, isopropyl alcohol and/or a suitable detergent. The initial degreasing process includes wiping down component 118 with a wipe wetted with acetone or other suitable solvent. The initial degreasing process substantially removes all petroleum based greases and oils and other greases and oils such as process residues and human skin oils from the component 118. The initial degreasing process can also remove a portion of the polymer residues such as silicon and metallic compound containing deposits present on the component.

The initial degreasing can also include immersing the component 118 in a quantity of acetone or other suitable solvent for about 10 minutes or more. The component 118 can be rotated and/or the solvent agitated at least one time during the 10 minutes. The component 118 can be wiped down for about one minute after the component has soaked in the acetone or other suitable solvent. The initial degreasing can also include rinsing the component 118 with ultrapure or deionized water, as will be described in more detail below. The rinsed component 118 can then be air dried or blow dried using clean dry air at about 45 psi+/−5 psi.

In an operation 325, a secondary degreasing process is applied to the component. The secondary degreasing process can use any suitable solvent such as isopropyl alcohol, ethyl alcohol (ethanol), methylene chloride and other suitable solvents and combinations and mixtures thereof. The secondary degreasing process includes immersing the component in a quantity of isopropyl alcohol or other suitable solvent and followed by wiping the component 118 with a wipe wetted with the isopropyl alcohol or other suitable solvent. The secondary degreasing process substantially removes any residues of the first degreasing process such as residues of the first solvent. The secondary degreasing process also substantially removes and any greases or oils remaining after the first degreasing process. The secondary degreasing can also include rinsing the component 118 with ultrapure or deionized water, as will be described in more detail below. The rinsed component 118 can then be air dried or blow dried using clean dry air at about 45 psi+/−5 psi.

In an operation 330, the surface of the component is etched to substantially remove the residue deposit materials on the surface of the component. The surface etch process 330 is described in more detail in FIG. 4 below.

Figure 3H:
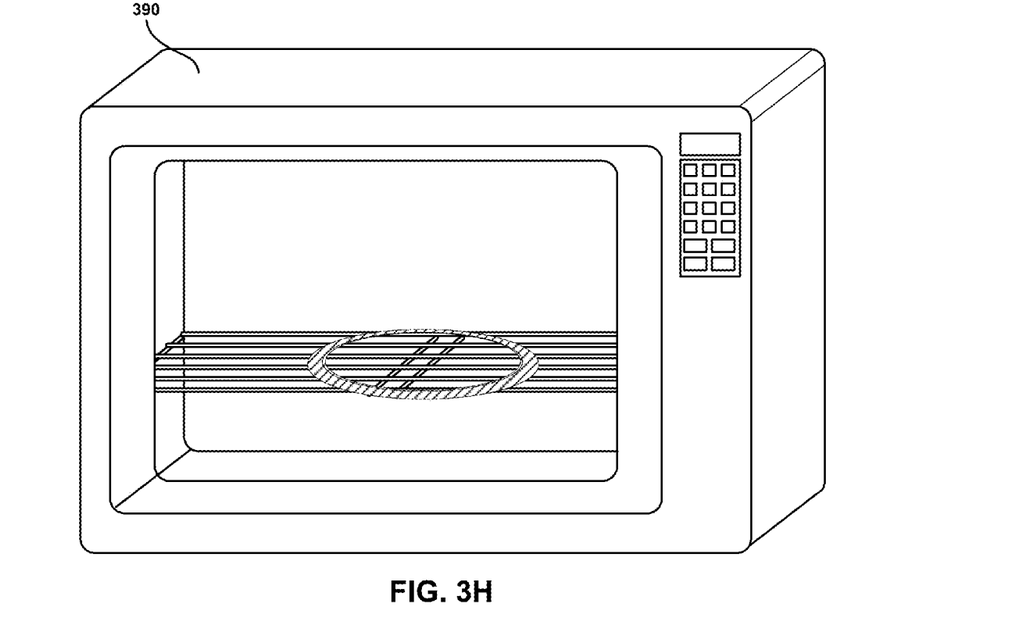
FIG. 3H shows the component supported in a drying oven, for implementing embodiments of the present disclosure.

In an operation 345, the cleaned component 118 is dried by baking the moisture and other volatile residues off the surface of the component. FIG. 3H shows the component 118 supported in a drying oven 390, for implementing embodiments of the present disclosure. In one implementation, the component 118 can be baked in the oven 390 or other suitable baking chamber at a temperature of between about 115 to about 125 degrees C. for more than about 2 hours. It should be understood that the oven 370 should be cleaned before use. By way of example, cleaning the oven 370 can include wiping the oven down using an isopropyl alcohol (IPA) wipe and/or using a 2% HNO3 solution wipe. The method operations can then end.

Figure 4:
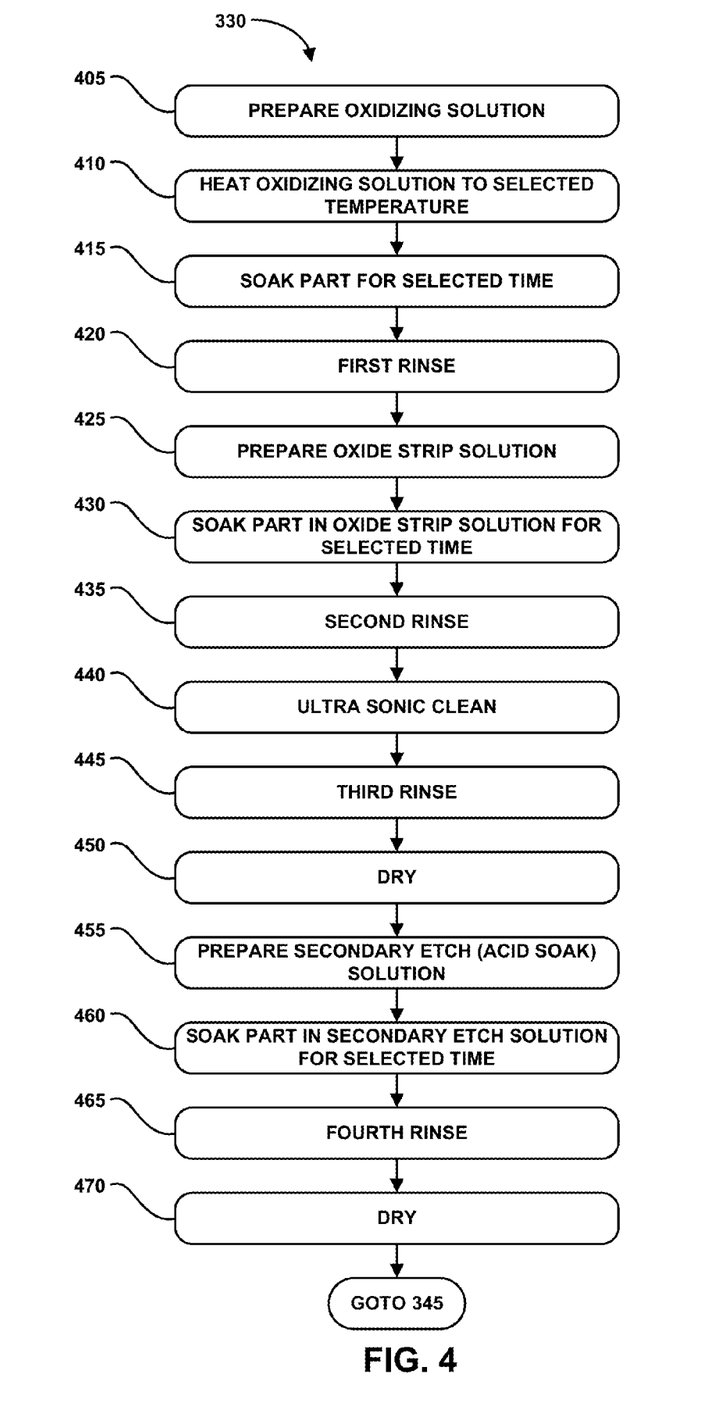
FIG. 4 is a flowchart diagram that illustrates the method operations performed in etching the surface of the used, process chamber components, for implementing embodiments of the present disclosure.

FIG. 4 is a flowchart diagram that illustrates the method operations 330 performed in etching the surface of the used, process chamber components, for implementing embodiments of the present disclosure. The operations illustrated herein are by way of example, as it should be understood that some operations may have sub-operations and in other instances, certain operations described herein may not be included in the illustrated operations. With this in mind, the method and operations 330 will now be described.

In an operation 405, a quantity of an oxidizing solution is prepared in a suitable container. One suitable oxidizing solution is about 45 to about 85 percent weight per volume potassium hydroxide (KOH) mixed with about 98 to about 100 percent weight per volume potassium permanganate (KMnO4) and deionized water (DIW) in a 65/27/8 percent by weight mixture. KMnO4/KOH mixture can be within the range of between about 45 percent and about 85 percent KMnO4. However, it should be understood that other suitable oxidizing solutions and combinations of other suitable oxidizing solutions can be used.

In an operation 410, the oxidizing solution is heated to the selected temperature. The selected temperature is less than a boiling point of the oxidizing solution. By way of example, the oxidizing solution can be KOH/KMnO4/DIW mixture and can be heated to between about 70 degrees C. and about 90 degrees C.

In an operation 415, the component 118 is placed in the heated oxidizing solution for a selected period of time. The component 118 can be placed in the heated oxidizing solution for between about 10 minutes and about 60 minutes. The component 118 should be fully immersed in the heated oxidizing solution substantially similar to immersing the component in the hot water bath as shown in FIGS. 3C and 3E. The oxidizing solution oxidizes the surface of the component 118. In an operation 420, the component is removed from the heated oxidizing solution and rinsed for about 2 minutes in a DIW rinse as described above in FIG. 3G.

In an operation 425, a quantity of an oxide stripping solution is prepared in a suitable container. One suitable oxide stripping solution is about 49 percent weight per volume hydrofluoric acid (HF), about 69 percent weight per volume nitric acid (HNO3) and DIW in a 1/1/1 part ratio. Alternatively, HF-rich or HNO3-rich acid mixtures can be used. It should be understood that other suitable oxide stripping solutions and combinations of other suitable oxidizing solutions can be used.

In an operation 430, the component 118 is placed in the oxide stripping solution for a selected period of time of between about 5 and about 20 minutes at about 15-30 degrees C. The oxide stripping solution strips the oxidized surface material from the component as well as any residues such as the metallic residues, as discussed above.

In an operation 435, the component 118 is removed from the oxide stripping solution and rinsed for about 3 minutes in a DIW rinse as described above in FIG. 3G.

In an operation 440, the component 118 is immersed in a DIW bath and an ultrasonic signal is applied to the DIW bath using an ultrasonic transducer 367 as shown in FIG. 3F. The ultrasonic signal can be any suitable frequency and power of between about 15+/−5 watts/square inch.

The component 118 is immersed in the DIW bath and the ultrasonic process time between about 5 and about 20 minutes. The DIW is maintained at a flow into the inner basin 362 as shown in FIG. 3C such that the DIW overflows 364 from the inner basin and into the outer basin 361. The DIW can be monitored for a resistance of greater than 2 megaohms. The turnover of the DIW in the inner basin 362 should be greater than about 1.5 where turnover is defined as (water flow rate) *(ultrasonic process time)/(volume of the inner basin 362).

In an operation 445, the component 118 is removed from the ultrasonic water bath and rinsed for at least about 3 minutes on each side of the component, in a DIW rinse as described above in FIG. 3G.

In an operation 450, the component 118 is dried using clean dry air or other suitable gas or gas mixture. Drying the component 118 removes most of the moisture from the surfaces of the component.

In an operation 455, a quantity of a secondary etch solution is prepared in a suitable container. One suitable secondary etch solution is about 49 percent weight per volume hydrofluoric acid (HF), about 69 percent weight per volume nitric acid (HNO3), about 100 percent per weight acetic acid (HAc) and DIW in a 1 part to 7.5 parts to 3.7 parts to 87.8 parts ratio. Alternatively, HF-rich or HNO3-rich acid mixtures can be used. However, it should be understood that other suitable etch solutions and combinations of other suitable etch solutions can be used.

In an operation 460, the component 118 is placed in the secondary etch solution for between about 5 minutes and about 20 minutes. The secondary etch solution further etches the surfaces of the component 118 and further removes a portion of surface material from the component as well as any residues such as the metallic residues, as discussed above.

In an operation 465, the component 118 is removed from the secondary etch solution and rinsed for at least about 3 minutes, in a DIW rinse as described above in FIG. 3G.

In an operation 470, the component 118 is dried using clean dry air or other suitable gas or gas mixture. Drying the component 118 removes most of the moisture from the surfaces of the component. The method operations continue in operation 345, as described above in FIG. 3.

The cleaned component can be prepared for reuse such as packaging and storage. The cleaned component is ready for reuse and can be installed in a plasma processing chamber that can then be used to applying a plasma process to one or more substrates placed in the plasma processing chamber.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for cleaning a component of a plasma processing chamber comprising:
removing the component to be cleaned from the plasma processing chamber, the removed component including at least one material deposited on the component;
applying a basic cleaning process to the removed component;
degreasing the removed component;
removing the at least one material deposited on the removed component to produce a cleaned component, the removing includes applying a heated oxidizing solution to the at least one material deposited on the removed component to oxidize a first portion of the at least one material deposited on the removed component, applying a stripping solution to the removed component to remove the oxidized first portion of the least one material from the removed component, and applying an etching solution to remove a second portion of the least one material from the removed component, the heated oxidizing solution includes a mixture of potassium hydroxide (KOH) and potassium permanganate (KMnO4) in a ratio of between about 5 parts potassium hydroxide (KOH) to about 2 parts potassium permanganate (KMnO4); and
drying the cleaned component.

2. The method of claim 1, wherein the oxidizing solution includes potassium hydroxide (KOH).

3. The method of claim 1, wherein the oxidizing solution includes potassium permanganate (KMnO4).

4. The method of claim 1, wherein the oxidizing solution includes a mixture of potassium hydroxide (KOH) and potassium permanganate (KMnO4).

5. The method of claim 1, wherein the stripping solution includes hydrofluoric acid (HF).

6. The method of claim 1, wherein the stripping solution includes nitric acid (HNO3).

7. The method of claim 1, wherein the stripping solution includes a mixture of hydrofluoric acid (HF) and nitric acid (HNO3).

8. The method of claim 1, wherein the etching solution includes hydrofluoric acid (HF).

9. The method of claim 1, wherein the etching solution includes nitric acid (HNO3).

10. The method of claim 1, wherein the etching solution includes acetic acid (HAc).

11. The method of claim 1, wherein the etching solution includes a mixture of hydrofluoric acid (HF), nitric acid (HNO3) and acetic acid (HAc).

12. The method of claim 1, wherein at least one of the oxidizing solution, the stripping solution and/or the etching solution is diluted with water.

13. The method of claim 1, further comprising:
installing the cleaned component in a plasma processing chamber;
disposing a substrate in the plasma processing chamber; and
applying a plasma process to the substrate.

14. A method for cleaning a component of a plasma processing chamber comprising:
removing the component to be cleaned from the plasma processing chamber, the removed component including at least one material deposited on the component;
applying a basic cleaning process to the removed component;
degreasing the removed component;
removing the at least one material deposited on the removed component to produce a cleaned component, the removing includes applying a heated oxidizing solution to the at least one material deposited on the removed component to oxidize a first portion of the at least one material deposited on the removed component, applying a stripping solution to the removed component to remove the oxidized first portion of the least one material from the removed component, and applying an etching solution to remove a second portion of the least one material from the removed component, the stripping solution includes a mixture of hydrofluoric acid (HF) and nitric acid (HNO3) in a ratio of about 1 part hydrofluoric acid (HF) and about 1 part nitric acid (HNO3); and
drying the cleaned component.

15. A method for cleaning a component of a plasma processing chamber comprising:
removing the component to be cleaned from the plasma processing chamber, the removed component including at least one material deposited on the component;
applying a basic cleaning process to the removed component;
degreasing the removed component;
removing the at least one material deposited on the removed component to produce a cleaned component, the removing includes applying a heated oxidizing solution to the at least one material deposited on the removed component to oxidize a first portion of the at least one material deposited on the removed component, applying a stripping solution to the removed component to remove the oxidized first portion of the least one material from the removed component, and applying an etching solution to remove a second portion of the least one material from the removed component, the etching solution includes a mixture of hydrofluoric acid (HF), nitric acid (HNO3) and acetic acid (HAc) in a ratio of about 1 part hydrofluoric acid (HF), about 7.5 parts nitric acid (HNO3) and about 3.7 parts acetic acid (HAc); and
drying the cleaned component.

16. A method for cleaning a component of a plasma processing chamber comprising:
removing the component to be cleaned from the plasma processing chamber, the removed component including at least one material deposited on the component;
applying a basic cleaning process to the removed component;
degreasing the removed component;
removing the at least one material deposited on the removed component to produce a cleaned component including:
applying a heated oxidizing solution to the at least one material deposited on the removed component to oxidize a first portion of the least one material deposited on the removed component, wherein the heated oxidizing solution includes a mixture of potassium hydroxide (KOH) and potassium permanganate (KMnO4) in a ratio of between about 5 parts potassium hydroxide (KOH) to about 2 parts potassium permanganate (KMnO4);
applying a stripping solution to the removed component to remove the oxidized first portion of the least one material from the removed component, wherein the stripping solution includes a mixture of hydrofluoric acid (HF) and nitric acid (HNO3) in a ratio of about 1 part hydrofluoric acid (HF) and about 1 part nitric acid (HNO3); and applying an etching solution to remove a second portion of the least one material from the removed component, wherein the etching solution includes a mixture of hydrofluoric acid (HF), nitric acid (HNO3) and acetic acid (HAc) in a ratio of about 1 part hydrofluoric acid (HF), about 7.5 parts nitric acid (HNO3) and about 3.7 parts acetic acid (HAc); and drying the cleaned component.

* * * * *